United States Patent
Watanabe et al.

(10) Patent No.: US 8,179,729 B2
(45) Date of Patent: May 15, 2012

(54) MEMORY CIRCUIT AND VOLTAGE DETECTION CIRCUIT INCLUDING THE SAME

(75) Inventors: Kotaro Watanabe, Chiba (JP); Tomohiro Oka, Chiba (JP); Teruo Suzuki, Chiba (JP)

(73) Assignee: Seiko Instruments Inc., Chiba (JP)

(*) Notice: Subject to any disclaimer, the term of this patent is extended or adjusted under 35 U.S.C. 154(b) by 178 days.

(21) Appl. No.: 12/847,147

(22) Filed: Jul. 30, 2010

(65) Prior Publication Data
US 2011/0032776 A1    Feb. 10, 2011

(30) Foreign Application Priority Data
Aug. 10, 2009 (JP) ................................. 2009-185982
Jun. 11, 2010 (JP) ................................. 2010-134002

(51) Int. Cl.
*G11C 5/14* (2006.01)
(52) U.S. Cl. ............ 365/189.09; 365/189.011; 365/191; 365/226
(58) Field of Classification Search ............. 365/189.09, 365/189.011, 191, 226
See application file for complete search history.

(56) References Cited

U.S. PATENT DOCUMENTS

| | | | |
|---|---|---|---|
| 5,926,433 A * | 7/1999 | McLaury | 365/230.06 |
| 6,449,207 B2 * | 9/2002 | Sher et al. | 365/226 |
| 7,002,863 B2 * | 2/2006 | Joo | 365/205 |
| 7,471,588 B2 * | 12/2008 | Yu et al. | 365/230.05 |
| 7,751,256 B2 * | 7/2010 | Chan et al. | 365/189.05 |
| 7,864,588 B2 * | 1/2011 | Betser et al. | 365/185.2 |

FOREIGN PATENT DOCUMENTS
JP  2008-123644 A  5/2008

* cited by examiner

*Primary Examiner* — Pho M Luu
(74) *Attorney, Agent, or Firm* — Brinks Hofer Gilson & Lione

(57) ABSTRACT

Provided are a memory circuit having a small circuit scale and a voltage detection circuit including the memory circuit. An NMOS transistor (21) is in an off state during loading and writing and is in an on state during reading. An NMOS transistor (22) is turned on when a high level input is received and turned off when a low level input is received. An NMOS transistor (23) is in the off state during loading and writing and is in the on state during reading. A PMOS transistor (26) is in the on state during loading and is in the off state during writing and reading. A PMOS transistor (27) is turned off when the high level input is received during loading, is turned on when the low level input is received during loading, and is in the on state during writing and reading.

7 Claims, 10 Drawing Sheets

MEMORY CIRCUIT AND VOLTAGE DETECTION CIRCUIT INCLUDING THE SAME

RELATED APPLICATIONS

This application claims priority under 35 U.S.C. §119 to Japanese Patent Application Nos. 2009-185982 filed on Aug. 10, 2009 and 2010-134002 filed on Jun. 11, 2010, the entire content of which is hereby incorporated by reference.

BACKGROUND OF THE INVENTION

1. Field of the Invention

The present invention relates to a memory circuit for reading and writing data from and into a nonvolatile memory element, and a voltage detection circuit including the memory circuit.

2. Description of the Related Art

In recent years, nonvolatile memory elements are used for various electronic devices.

For example, although not illustrated, a plurality of nonvolatile memory elements are arranged in matrix. In reading data, a read circuit is electrically connected to a nonvolatile memory element to read the data. When the reading of data is completed, the read circuit is disconnected from the nonvolatile memory element. In this case, the read data is latched in the read circuit.

As illustrated in FIG. 10, data in a nonvolatile memory element is suitably read to an internal circuit of an integrated circuit (IC) and used to change the setting of the circuit. Nonvolatile memory elements 109 and 110 are provided as a pair. A write circuit 105 writes data into the nonvolatile memory elements 109 and 110 so that the nonvolatile memory element 110 has a logical value "1" in a case where the nonvolatile memory element 109 has a logical value "0". A read circuit 106 reads data from the nonvolatile memory elements 109 and 110 at a predetermined timing (see, for example, Japanese Patent Application Laid-open No. 2008-123644 (FIG. 2)).

In the conventional technology, a memory circuit requires separately the write circuit 105 and the read circuit 106. Therefore, a circuit scale of the memory circuit becomes lager.

SUMMARY OF THE INVENTION

The present invention has been made in view of the problem described above. An object of the present invention is to provide a memory circuit having a small circuit scale and a voltage detection circuit including the memory circuit.

In order to solve the above-mentioned problem, the present invention provides a memory circuit including: a first switch provided between a first signal node and a second signal node; a nonvolatile memory element of a first conductivity type, including a source connected to a first power supply terminal; an inverter; a first MOS transistor of a second conductivity type which is controlled to an off state when the data is loaded to and written into the nonvolatile memory element, and controlled to an on state when the data is read, the first MOS transistor including a source connected to a second power supply terminal and a drain connected to the second signal node; a second MOS transistor of the second conductivity type which is turned on when a first power supply voltage is input and turned off when a second power supply voltage is input, the second MOS transistor including a gate connected to the second signal node, a source connected to the second power supply terminal, and a drain connected to an input terminal of the inverter; a third MOS transistor of the second conductivity type which is controlled to an off state when the data is loaded to and written into the nonvolatile memory element, and controlled to an on state when the data is read, the third MOS transistor including a source connected to the second power supply terminal through a current source and a drain connected to the input terminal of the inverter; a fourth MOS transistor of the first conductivity type, including a source connected to the first power supply terminal; a fifth MOS transistor of the first conductivity type, including a source connected to a drain of the nonvolatile memory element and a drain of the fourth MOS transistor, and a drain connected to the input terminal of the inverter; a first control circuit for controlling the fourth MOS transistor so that the fourth MOS transistor is turned on during loading and is turned off during writing and reading; and a second control circuit for controlling the fifth MOS transistor so that the fifth MOS transistor is turned off when the first power supply voltage is input during loading, turned on when the second power supply voltage is input during loading, and turned off during writing and reading.

According to the present invention, a write circuit is not separately required, and hence a circuit scale of the memory circuit becomes smaller.

DETAILED DESCRIPTION OF THE PREFERRED EMBODIMENT

Hereinafter, an embodiment of the present invention is described with reference to the attached drawings.

Figure 1:
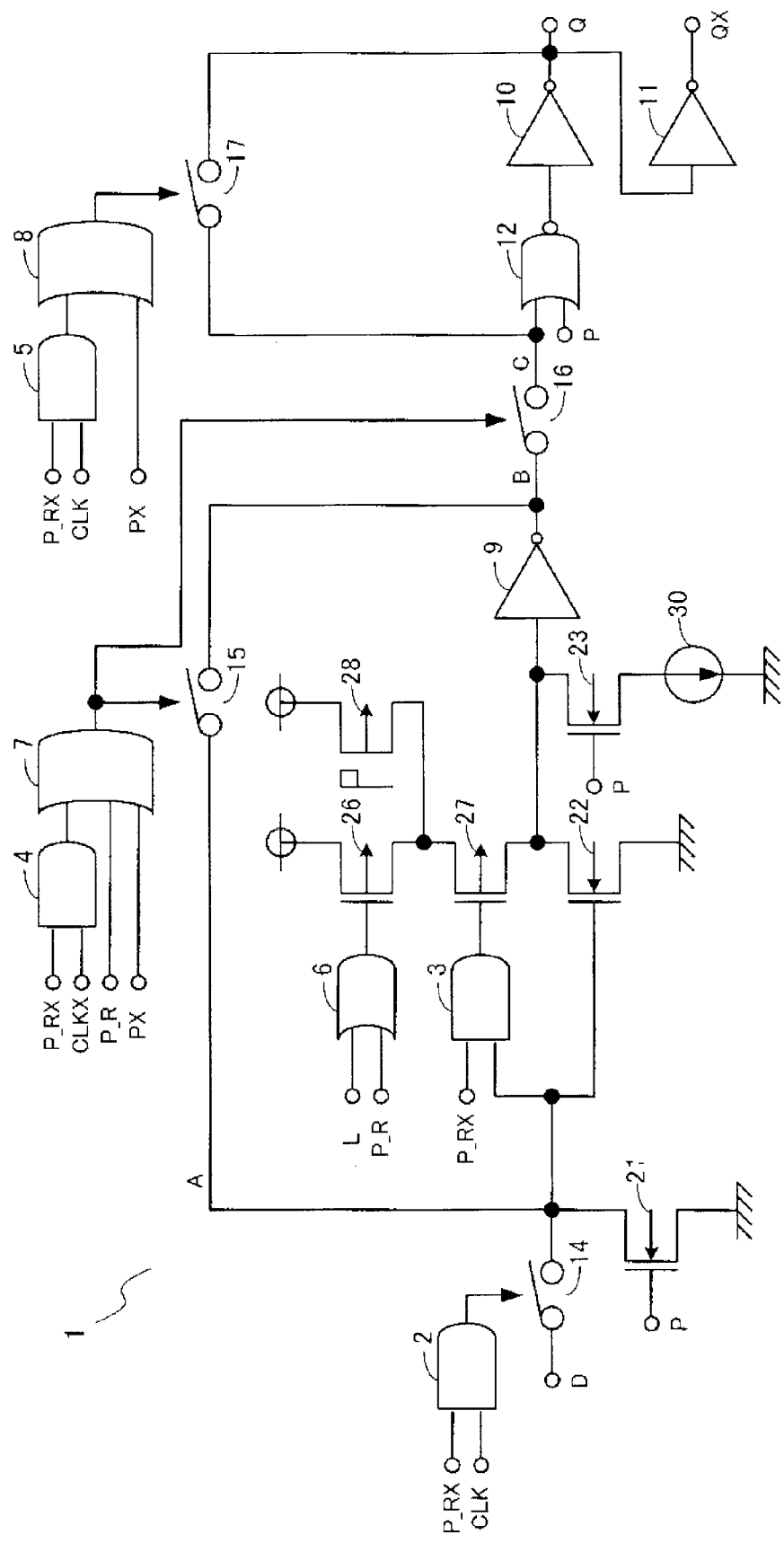
FIG. 1 illustrates a memory circuit according to an embodiment of the present invention.

A configuration of a memory circuit according to the embodiment of the present invention is described. FIG. 1 illustrates the memory circuit.

A memory circuit 1 includes AND circuits 2 to 5, OR circuits 6 to 8, inverters 9 to 11, a NOR circuit 12, switches 14 to 17, NMOS transistors 21 to 23, PMOS transistors 26 and 27, a nonvolatile memory element 28, and a current source 30.

The AND circuit 2 includes a first input terminal connected to a terminal for a signal P_RX and a second input terminal connected to a terminal for a clock signal CLK. The switch 14 is provided between a terminal for a signal D and a node for a signal A and controlled in response to an output signal from the AND circuit 2. The NMOS transistor 21 includes a gate connected to a terminal for a signal P, a source connected to a ground terminal, and a drain connected to the node for the signal A.

The OR circuit 6 includes a first input terminal connected to a terminal for a signal L, a second input terminal connected to a terminal for a signal P_R, and an output terminal connected to a gate of the PMOS transistor 26. The AND circuit 3 includes a first input terminal connected to the terminal for the signal P_RX, a second input terminal connected to the node for the signal A, and an output terminal connected to a gate of the PMOS transistor 27. A source of the PMOS transistor 26 is connected to a power supply terminal and a drain thereof is connected to a drain of the nonvolatile memory element 28 and a source of the PMOS transistor 27. A source of the nonvolatile memory element 28 is connected to the power supply terminal. A drain of the PMOS transistor 27 is connected to drains of the NMOS transistors 22 and 23 and an input terminal of the inverter 9.

The switch 15 is provided between the node for the signal A and a node for a signal B and controlled in response to an output signal from the OR circuit 7. A gate of the NMOS transistor 22 is connected to the node for the signal A and a source thereof is connected to the ground terminal. A gate of the NMOS transistor 23 is connected to the terminal for the signal P. The current source 30 is provided between a source of the NMOS transistor 23 and the ground terminal. An output terminal of the inverter 9 is connected to the node for the signal B.

The switch 16 is provided between the node for the signal B and a node for a signal C and controlled in response to the output signal from the OR circuit 7. The NOR circuit 12 includes a first input terminal connected to the node for the signal C, a second input terminal connected to the terminal for the signal P, and an output terminal connected to an input terminal of the inverter 10. The switch 17 is provided between the node for the signal C and a terminal for a signal Q and controlled in response to an output signal from the OR circuit 8. An output terminal of the inverter 10 is connected to the terminal for the signal Q. The inverter 11 includes an input terminal connected to the terminal for the signal Q and an output terminal connected to a terminal for a signal QX.

The AND circuit 4 includes a first input terminal connected to the terminal for the signal P_RX, a second input terminal connected to a terminal for a clock signal CLKX, and an output terminal connected to a first input terminal of the OR circuit 7. A second input terminal of the OR circuit 7 is connected to the terminal for the signal P_R and a third input terminal thereof is connected to a terminal for a signal PX. The AND circuit 5 includes a first input terminal connected to the terminal for the signal P_RX, a second input terminal connected to the terminal for the clock signal CLK, and an output terminal connected to a first input terminal of the OR circuit 8. A second input terminal of the OR circuit 8 is connected to the terminal for the signal PX.

Figure 2:
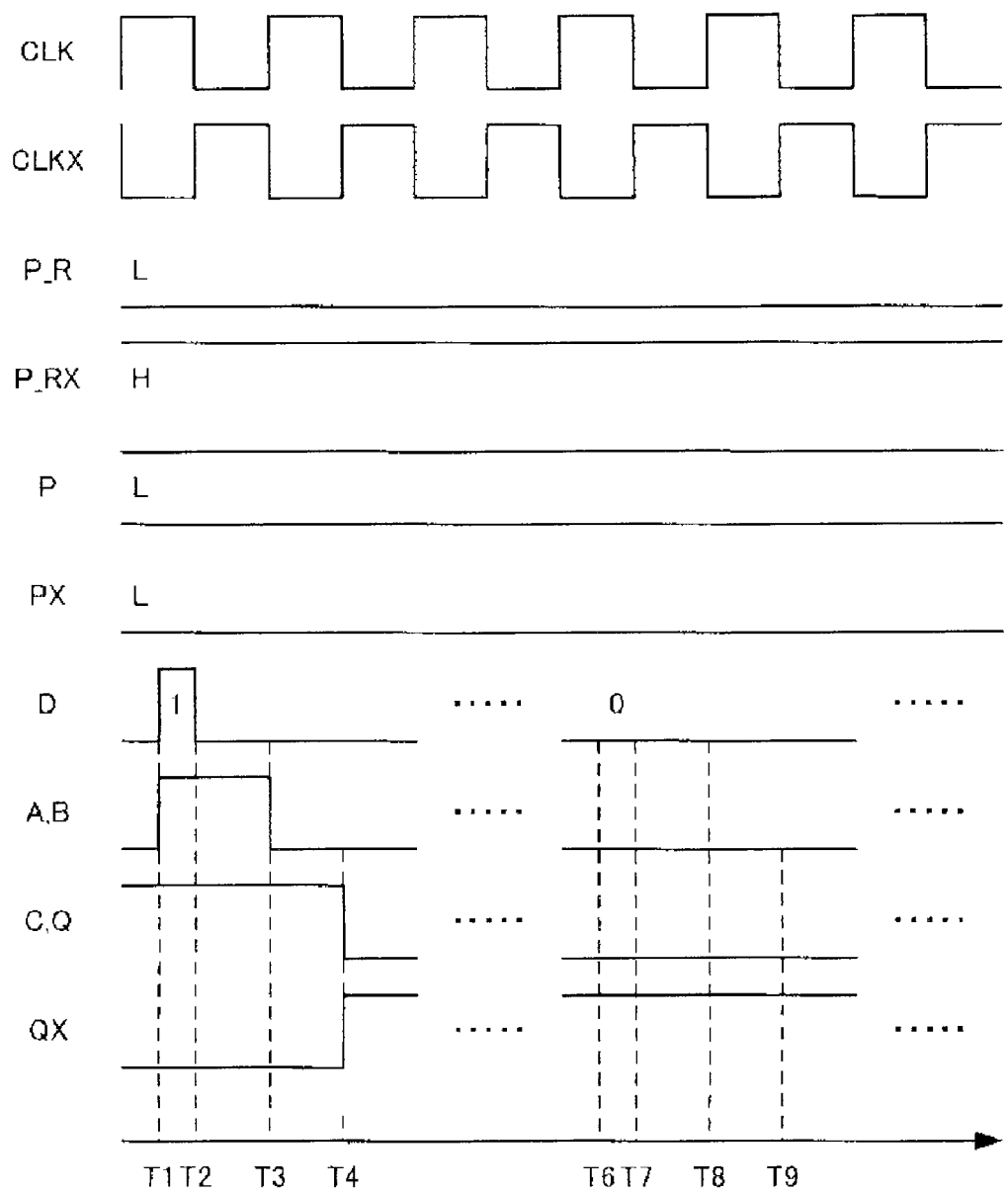
FIG. 2 is a time chart illustrating an operation of the memory circuit.

Next, an operation of the memory circuit 1 is described. FIG. 2 is a time chart illustrating the operation of the memory circuit.

Note that, the signal L is controlled to a low level during loading and controlled to a high level during writing and reading.

<During Loading>

[Operation Between Times T1 and T2 (Case where Signal D is 1)]

As illustrated in FIG. 2, the signals P_R, P, and PX are controlled to the low level, and the signal P_RX is controlled to the high level. At this time, the signal P is in the low level, and hence the NMOS transistors 21 and 23 are in an off state. The signals L and P_R are in the low level, and hence the output signal from the OR circuit 6 is in the low level and thus the OR circuit 6 operates to turn on the PMOS transistor 26. The signal P_RX and the clock signal CLK are in the high level, and hence the output signal from the AND circuit 2 is in the high level and thus the AND circuit 2 operates to turn on the switch 14. Then, the signal D having the high level is input, and hence the signal A becomes the high level. The signal A is in the high level, and hence the NMOS transistor 22 is turned on. Therefore, an input signal of the inverter 9 becomes the low level and thus the signal B becomes the high level.

The signals P_RX and A are in the high level, and hence the output signal from the AND circuit 3 is in the high level and thus the AND circuit 3 operates to turn off the PMOS transistor 27.

[Operation Between Times T2 and T3 (Case where Signal D is 1)]

The signal P_RX is in the high level and the clock signal CLKX is in the high level, and hence the output signal from the AND circuit 4 is in the high level. Then, the output signal from the OR circuit 7 is also in the high level and thus the OR circuit 7 operates to turn on the switches 15 and 16. That is, the signals A and B are fed back to be in the high level and thus the signal C is also in the high level. The signal C is in the high level and the signal P is in the low level, and hence an input signal of the inverter 10 is in the low level. Therefore, the signal Q is in the high level and the signal QX is in the low level.

[Operation Between Times T3 and T4 (Case where Signal D is 1)]

The signal P_RX is in the high level and the clock signal CLK is in the high level, and hence the output signal from the AND circuit 5 is in the high level. Then, the output signal from the OR circuit 8 is also in the high level and thus the OR circuit 8 operates to turn on the switch 17. That is, the signals C and Q are fed back to be in the high level and thus the signal QX is in the low level.

<During Writing>

Although not illustrated, the signal P is controlled to the low level, and hence the NMOS transistors 21 and 23 are in the off state. The signals L and P_R are controlled to the high level, and hence the output signal from the OR circuit 6 is in the high level and thus the OR circuit 6 operates to turn off the PMOS transistor 26. A power supply voltage (VDD) is controlled to a value higher than a voltage in a normal state. Therefore, because the signal P_RX is controlled to the low level, the output signal from the AND circuit 3 is in the low level and thus the AND circuit 3 operates to turn on the PMOS transistor 27. In this case, the PMOS transistor 27 is turned on and the NMOS transistor 22 is also turned on, and hence a source-drain voltage of the nonvolatile memory element 28 becomes higher and a threshold voltage of the nonvolatile memory element 28 becomes lower, to thereby write data into the nonvolatile memory element 28.

<During Reading>

Although not illustrated, when data is read from the nonvolatile memory element 28, the switches 15 and 16 are controlled to be turned off and the NMOS transistors 21 and 23 are controlled to be turned on. Then, the signal A becomes the low level, and hence the output signal from the AND circuit 3 becomes the low level, to thereby turn on the PMOS transistor 27 and turn off the NMOS transistor 22. The signal P_R is controlled to the high level, and hence the output signal from the OR circuit 6 becomes the high level, to thereby turn off the PMOS transistor 26. Then, a drive current of the nonvolatile memory element 28 becomes larger than a constant current of the current source 30 because the nonvolatile memory element 28 stores written data. Therefore, the input signal of the inverter 9 becomes the high level and the signal B becomes the low level. In this case, after a lapse of a predetermined time necessary to completely determine the input signal of the inverter 9, the switches 15 and 16 are controlled to be turned on and the NMOS transistors 21 and 23 are controlled to be turned off. Then, the signal C becomes the low level, and hence the input signal of the inverter 10 becomes the high level. Thus, the signal Q becomes the low level and the signal QX becomes the high level. The signal from the nonvolatile memory element 28 is fed back and held by the switch 15 being turned on, and read by the switch 16 being turned on. The held signal (signal B) may be directly read.

<During Loading>
[Operation Between Times T6 and T7 (Case where Signal D is 0)]

As described above, the NMOS transistors 21 and 23 are in the off state. The OR circuit 6 operates to turn on the PMOS transistor 26. The AND circuit 2 operates to turn on the switch 14. Then, the signal D having the low level is input, and hence the signal A also becomes the low level. The signal A is in the low level, and hence the NMOS transistor 22 is turned off. Therefore, the input signal of the inverter 9 becomes the high level and then the signal B becomes the low level.

Note that, the signal A is in the low level, and hence the output signal from the AND circuit 3 is in the low level and thus the AND circuit 3 operates to turn on the PMOS transistor 27. The signals L and P_R are in the low level, and hence the output signal from the OR circuit 6 is in the low level and thus the OR circuit 6 operates to turn on the PMOS transistor 26.

[Operation Between Times T7 and T8 (Case where Signal D is 0)]

As described above, the OR circuit 7 operates to turn on the switches 15 and 16. That is, the signals A and B are fed back to be in the low level and thus the signal C is also in the low level. The signal C is in the low level and the signal P is in the low level, and hence the input signal of the inverter 10 is in the high level. Therefore, the signal Q is still in the low level and the signal QX is still in the high level.

[Operation Between Times T8 and T9 (Case where Signal D is 0)]

As described above, the OR circuit 8 operates to turn on the switch 17. That is, the signals C and Q are fed back to be in the low level and the signal QX is in the high level.

<During Writing>
The power supply voltage (VDD) is controlled to a value higher than the voltage in the normal state. Therefore, the signal P_RX is controlled to the low level, and hence the output signal from the AND circuit 3 is in the low level and thus the AND circuit 3 operates to turn on the PMOS transistor 27 (in this case, signal A is in low level, and hence output signal from AND circuit 3 is in low level; PMOS transistor 27 is already in on state). In this case, the PMOS transistor 27 is turned on but the NMOS transistors 22 and 23 are turned off, and hence the source-drain voltage of the nonvolatile memory element 28 does not become higher and thus data is not written into the nonvolatile memory element 28.

<During Reading>
The nonvolatile memory element 28 does not store written data, and hence the drive current of the nonvolatile memory element 28 is smaller than the constant current of the current source 30. Therefore, the input signal of the inverter 9 becomes the low level and the signal B becomes the high level.

When the single memory circuit 1 is prepared, the switch 15 is unnecessary. Therefore, there is no case where the signals A and B are fed back and held.

Figure 3:
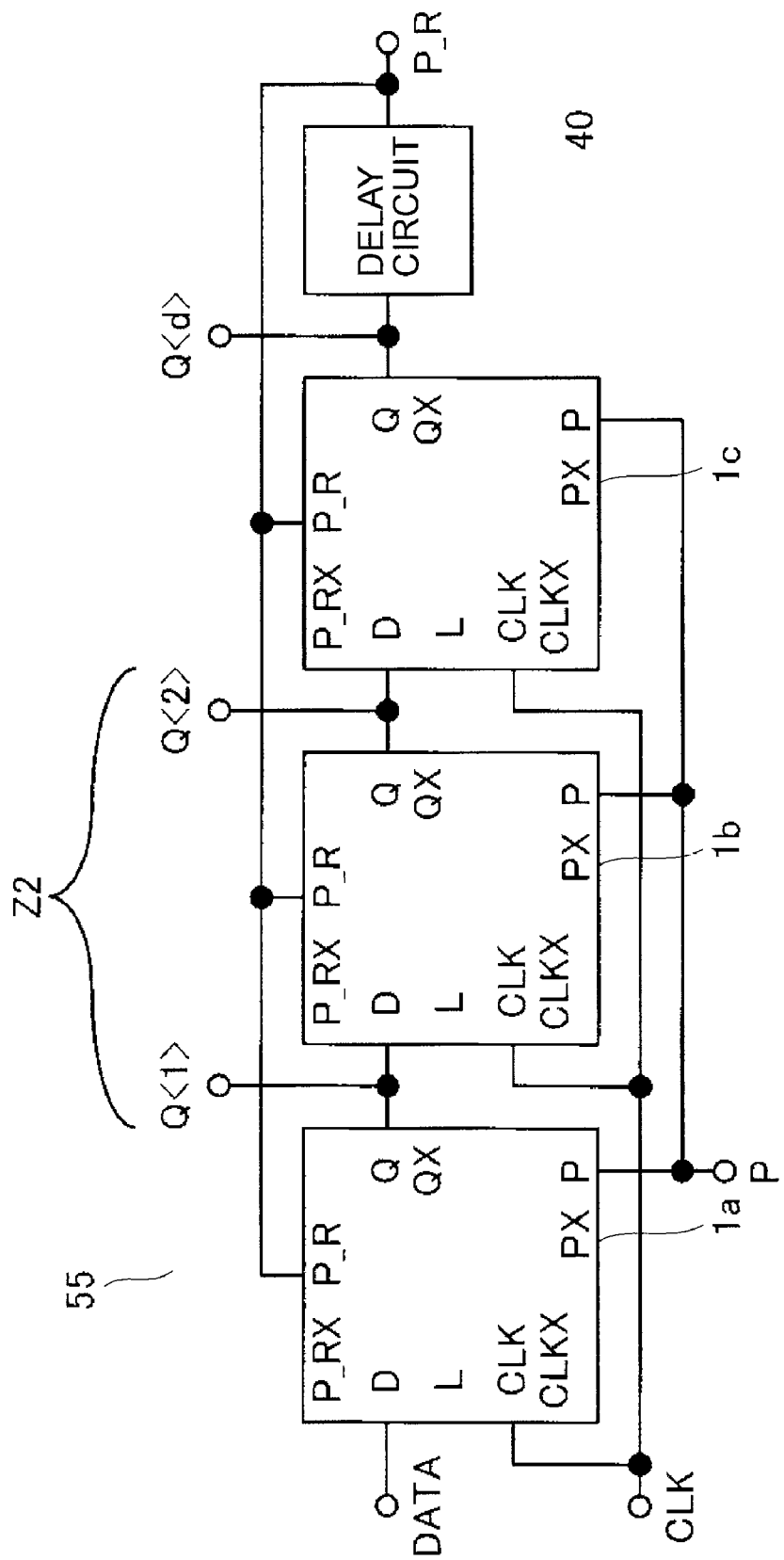
FIG. 3 is a block diagram illustrating a counter to which the memory circuit is applied.

The memory circuit 1 may be applied to a counter. FIG. 3 is a block diagram illustrating the counter.

A counter 55 includes memory circuits 1a, 1b, and 1c each of which is the memory circuit 1, and a delay circuit 40.

The terminal for the signal P_R in each of the memory circuits is connected to a terminal for the signal P_R in the counter 55. The terminal for the clock signal CLK in each of the memory circuits is connected to a terminal for the clock signal CLK in the counter 55. The terminal for the signal P in each of the memory circuits is connected to a terminal for the signal P in the counter 55. A terminal for a data signal DATA in the counter 55 is connected to a terminal for the signal D in the memory circuit 1a. A terminal for the signal Q in the memory circuit 1a is connected to a terminal for the signal D in the memory circuit 1b through a terminal for a signal Q<1>. A terminal for the signal Q in the memory circuit 1b is connected to a terminal for the signal D in the memory circuit 1c through a terminal for a signal Q<2>. A terminal for the signal Q in the memory circuit 1c is connected to the terminal for the signal P_R in the counter 55 through a terminal for a signal Q<d> and the delay circuit 40 in order.

Figure 4:
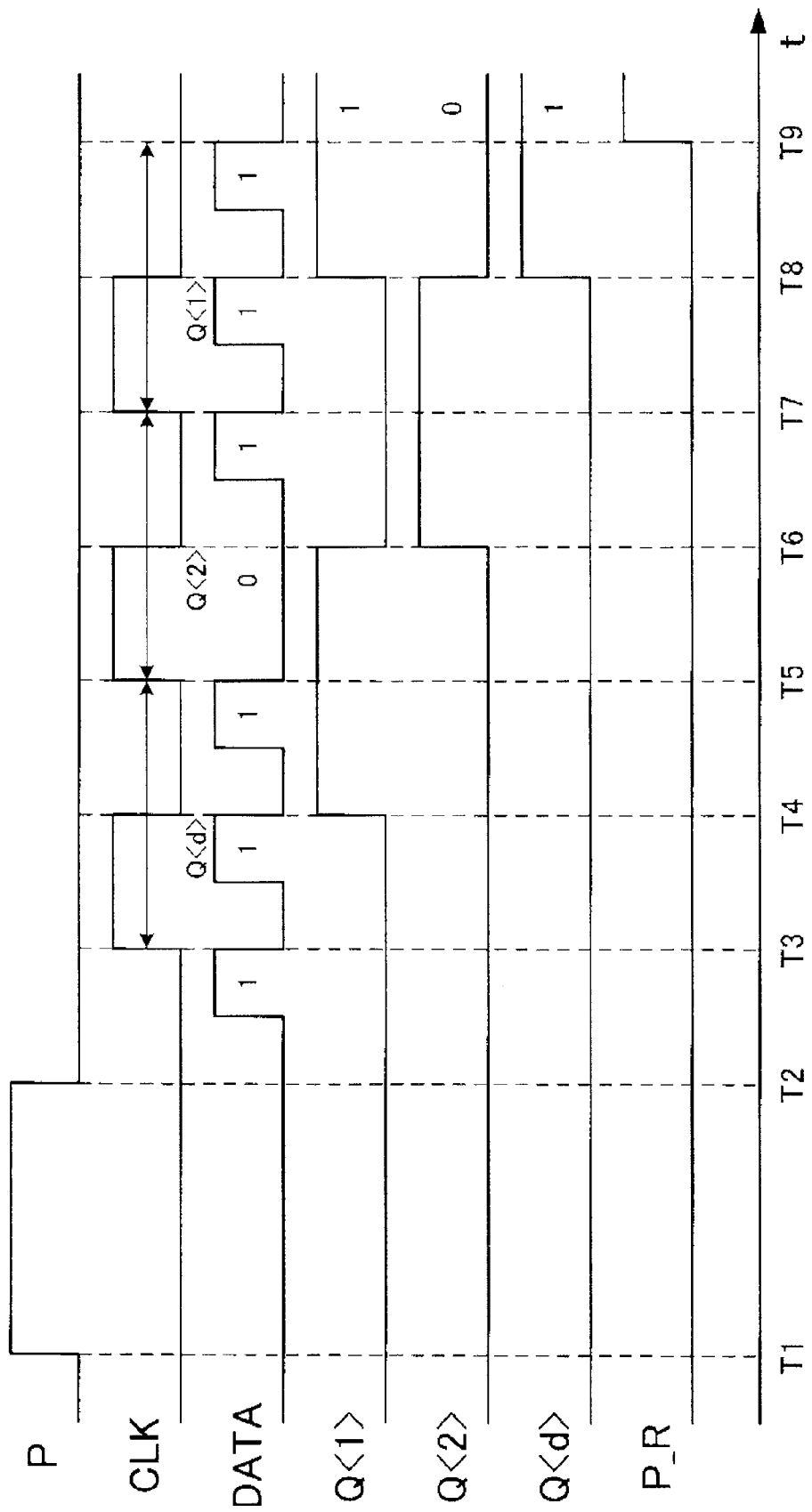
FIG. 4 is a time chart illustrating an operation of the counter.

Next, an operation of the counter 55 serving as a shift register is described. FIG. 4 is a time chart illustrating the operation of the counter.

[Operation in Case of T1≦t≦T2]

The signal P is controlled to the high level. Then, in each of the memory circuits, the NMOS transistors 21 and 23 illustrated in FIG. 1 are turned on to reset predetermined internal nodes, to thereby reset the memory circuits itself.

[Operation Related to Clock Signal CLK and Data Signal DATA in Case of T2<t<T9]

During each of a period between times T3 and T4, a period between times T5 and T6, and a period between times T7 and T8, the clock signal CLK having the high level is input. The data signals DATA are input at the falling edges of the clock signals CLK. Only the data signal DATA input at the falling edge corresponding to the time T6 is in the low level, and the other data signals DATA are in the high level.

During those periods, the signal P_R is controlled to the low level.

[Operation Related to Signals Q<1:2> and Q<d> in Case of T4<t<T9]

As is apparent from the signal Q<1> illustrated in FIG. 4, the data signal DATA is in the high level at the falling edge of the first clock signal CLK which corresponds to the time T4, and hence the signal Q<1> is in the high level. Then, the data signal DATA is in the low level at the falling edge of the next clock signal CLK, and hence the signal Q<1> is in the low level. Then, the data signal DATA is in the high level at the falling edge of the further next clock signal CLK, and hence the signal Q<1> is in the high level. As is apparent from the signal Q<2> illustrated in FIG. 4, the signal Q<2> is delayed from the signal Q<1> by one period of the clock signal CLK. As is apparent from the signal Q<d> illustrated in FIG. 4, the signal Q<d> is delayed from the signal Q<2> by one period of the clock signal CLK. Then, at a time T9, the signals Q<1:2> and Q<d> are set to <1, 0, 1>.

[Operation in Case of t=T9]

In each of the memory circuits, after a lapse of a predetermined time from the rising of the signal Q<d> which corresponds to the time T8, that is, after a lapse of a predetermined time from the start of setting of a last signal, the signal P_R is controlled by the delay circuit 40 to the high level. The signal P_RX is an inverted signal of the signal P_R. When the signal P_RX becomes the low level, the output signal from the AND circuit 2 illustrated in FIG. 1 becomes the low level and thus the AND circuit 2 operates to turn off the switch 14. Then, the setting of the signals Q<1:2> and Q<d> is completed and further signal setting is inhibited.

Figure 5:
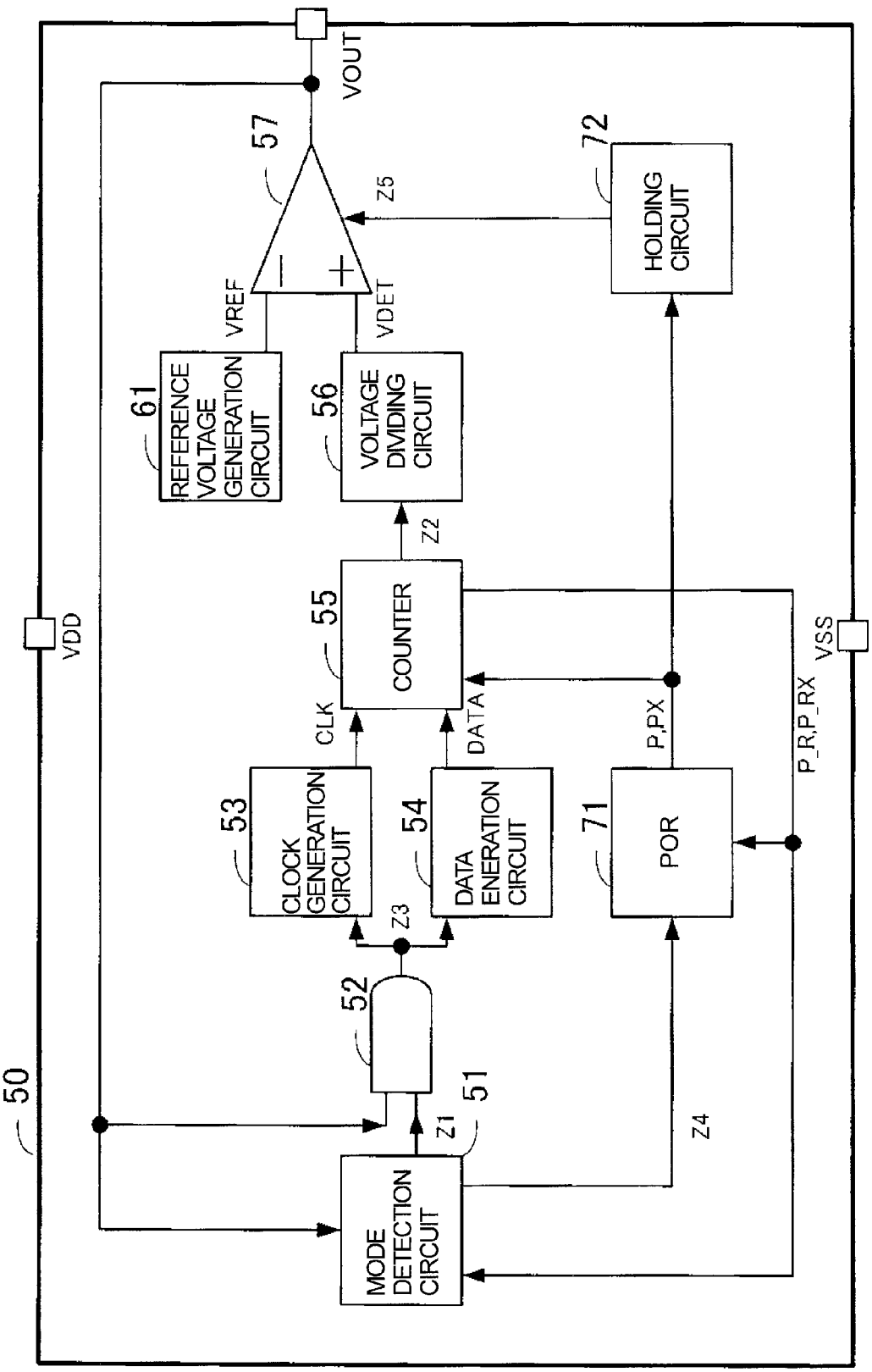
FIG. 5 is a block diagram illustrating a voltage detection circuit to which the counter is applied.
Figure 6:
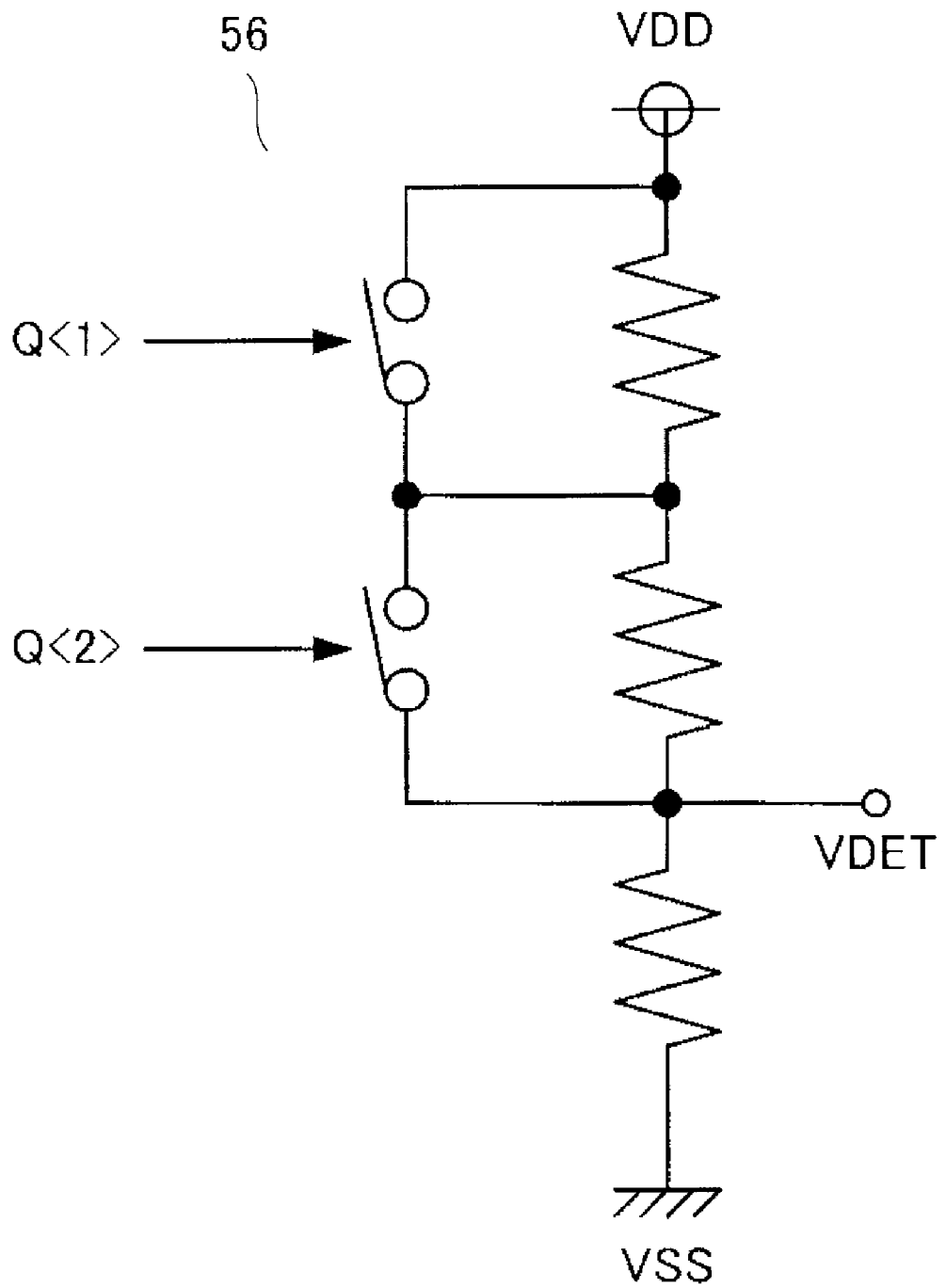
FIG. 6 illustrates a voltage dividing circuit of the voltage detection circuit.

The counter 55 may be applied to a voltage detection circuit for detecting whether or not a voltage, for example, the power supply voltage (VDD) is higher than a detection voltage. A configuration of the voltage detection circuit is described. FIG. 5 is a block diagram illustrating the voltage detection circuit. FIG. 6 is a voltage dividing circuit included in the voltage detection circuit.

A voltage detection circuit 50 includes a mode detection circuit 51, an AND circuit 52, a clock generation circuit 53, a data generation circuit 54, a power-on reset circuit (POR) 71, the counter 55, a voltage dividing circuit 56, a comparator 57, a reference voltage generation circuit 61, and a holding circuit 72. The voltage detection circuit 50 further includes a power supply terminal, a ground terminal, and an output terminal.

The mode detection circuit 51 operates based on an output voltage VOUT, the signal P_R, and the signal P_RX to generate signals Z1 and Z4. The AND circuit 52 operates based on the output voltage VOUT and the signal Z1 to generate a signal Z3. The clock generation circuit 53 and the data generation circuit 54 operate based on the signal Z3 to generate the clock signal CLK and the data signal DATA, respectively. The counter 55 operates based on the clock signal CLK, the data signal DATA, the signal P, and the signal PX to generate set data Z2, the signal P_R, and the signal P_RX. The voltage dividing circuit 56 operates based on the set data Z2 to generate a divided voltage VDET. The divided voltage VDET is input to a non-inverting input terminal of the comparator 57, a reference voltage VREF is input to an inverting input terminal thereof, and the output voltage VOUT is output from an output terminal thereof. The comparator 57 operates based on a signal Z5. The POR 71 operates based on the signals Z4, P_R, and P_RX to generate the signals P and PX. The holding circuit 72 operates based on the signals P and PX to generate the signal Z5.

The counter 55 corresponds to the counter 55 illustrated in FIG. 3. As illustrated in FIG. 6, the voltage dividing circuit 56 includes a plurality of resistors connected in series between the power supply voltage VDD and a ground voltage VSS. The plurality of resistors are connected in parallel to a plurality of switches. In the voltage dividing circuit 56, the respective switches are on/off-controlled in response to the signals Q<1:2> so that a voltage division ratio is adjusted to change the divided voltage VDET.

Next, an operation of the voltage detection circuit 50 is described.

The reference voltage generation circuit 61 generates the reference voltage VREF. The voltage dividing circuit 56 divides the power supply voltage VDD based on the voltage division ratio to generate the divided voltage VDET. The comparator 57 compares the reference voltage VREF with the divided voltage VDET. When "divided voltage VDET>reference voltage VREF" ("power supply voltage VDD>detection voltage"), the output voltage VOUT is in the high level. When "divided voltage VDET<reference voltage VREF" ("power supply voltage VDD<detection voltage"), the output voltage VOUT is in the low level.

Next, an outline of a method of setting the voltage division ratio of the voltage dividing circuit 56 is described.

In a case where the set data Z2 for setting the voltage division ratio of the voltage dividing circuit 56 is not input to the voltage dividing circuit 56, the voltage division ratio is an initialized voltage division ratio, specifically, a voltage division ratio obtained when the respective switches of the voltage dividing circuit 56 are turned on. In this case, when the power supply voltage VDD is gradually reduced to hold "initialized divided voltage VDET<reference voltage VREF", the output voltage VOUT becomes the low level. The power supply voltage VDD determined when the output voltage VOUT becomes the low level is monitored. The divided voltage VDET is precisely calculated based on the monitored power supply voltage VDD and the initialized voltage division ratio. In other words, the precise reference voltage VREF is determined. After that, a new voltage division ratio is calculated based on the precise reference voltage VREF and a new desired detection voltage determined by the voltage detection circuit 50.

Next, a detailed method of setting the voltage division ratio of the voltage dividing circuit 56 is described.

Figure 7:
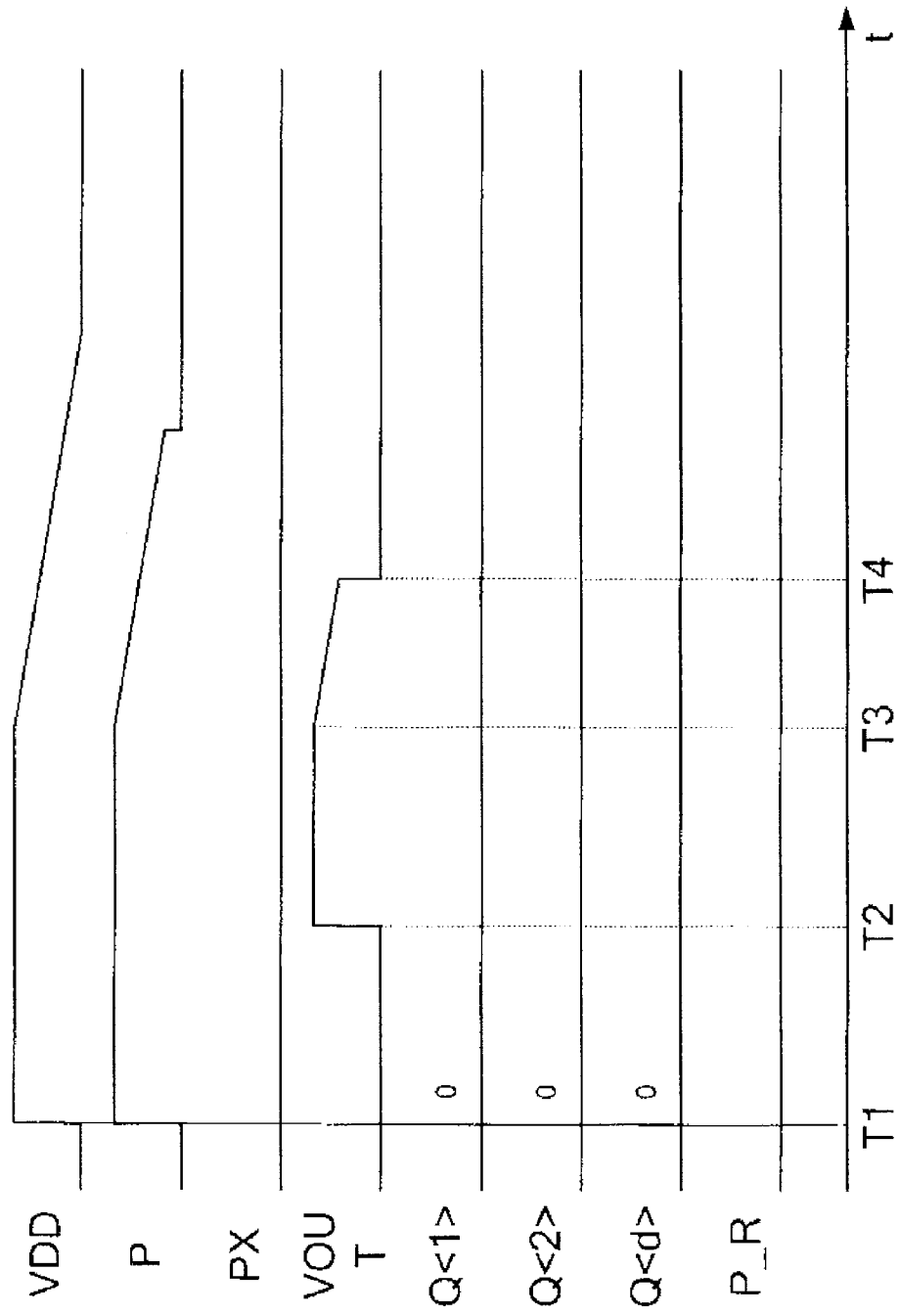
FIG. 7 is a first time chart illustrating a method of setting a voltage division ratio of the voltage dividing circuit.

An operation for calculating the set data Z2 corresponding to the new desired detection voltage described above is first described. FIG. 7 is a first time chart illustrating the method of setting the voltage division ratio of the voltage dividing circuit 56.

[Operation in Case of t=T1]

As illustrated in FIG. 7, the power supply voltage VDD rises and the signal P from the POR 71 also rises along with the rising to become the high level.

[Operation in Case of T1<t<T2]

When the signal P rises, the holding circuit 72 controls the comparator 57 to keep the output voltage VOUT to the low level.

[Operation in Case of t=T2]

After a lapse of a predetermined time from the time T1, the holding circuit 72 releases the above-mentioned control on the comparator 57. In this case, the power supply voltage VDD is rising, and the power supply voltage VDD is set to a value higher than the detection voltage. In other words, the initialized divided voltage VDET of the voltage dividing circuit 56 is higher than the reference voltage VREF of the reference voltage generation circuit 61. Therefore, the output voltage VOUT of the comparator 57 is in the high level.

[Operation in Case of t>T3]

The power supply voltage VDD is controlled to reduce. With the reduction, the output voltage VOUT becomes lower.

[Operation in Case of t=T4]

The power supply voltage VDD reduces and the initialized divided voltage VDET also reduces. When the divided voltage VDET is lower than the reference voltage VREF, the output voltage VOUT becomes the low level. As described above, the precise reference voltage VREF is determined. After that, a new voltage division ratio is calculated based on the precise reference voltage VREF and a new desired detection voltage determined by the voltage detection circuit 50. The set data Z2 corresponding to the new desired detection voltage is also calculated.

During the operation for calculating the set data Z2 as described above, the signal Q<d> is controlled to the low level. With such control, the signal P_R and the signals Q<1:2> associated with the set data are also controlled to the low level.

Figure 8:
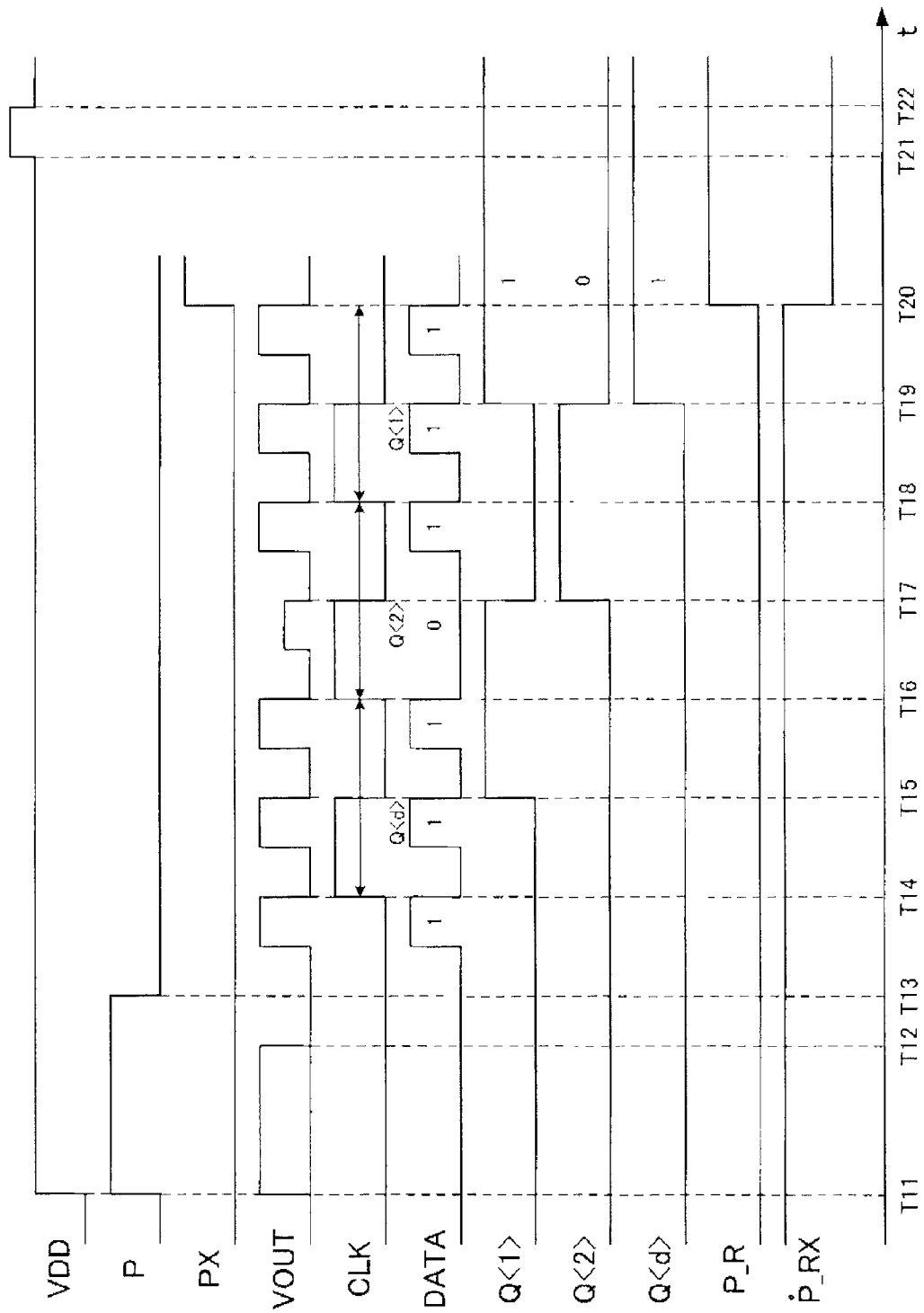
FIG. 8 is a second time chart illustrating the method of setting the voltage division ratio of the voltage dividing circuit.

Next, an operation for writing the set data Z2 into the counter 55 is described. FIG. 8 is a second time chart illustrating the method of setting the voltage division ratio of the voltage dividing circuit.

[Operation in Case of t=T11]

As illustrated in FIG. 8, the power supply voltage VDD rises, and with the rising, the signal P from the POR 71 also rises and becomes the high level. In this case, the divided voltage VDET is higher than the reference voltage VREF, and hence the output voltage VOUT of the comparator 57 is in the high level.

[Operation in Case of T12<t<T13]

During this period, with respect to the output voltage VOUT, the output terminal of the voltage detection circuit 50 is connected to an external power source and a voltage of zero volts is applied.

[Operation in Case of t=T13]

In a case where the divided voltage VDET is higher than the reference voltage VREF and the output voltage VOUT is in the low level, after a predetermined time elapses from a time when the output voltage VOUT becomes the low level, the mode detection circuit 51 controls the POR 71 so that the signal P from the POR 71 becomes the low level. The signal Z1 from the mode detection circuit 51 is controlled to the high level.

[Operation Related to Output Voltage VOUT, Clock Signal CLK, and Data Signal DATA in Case of T13<t<T20]

As is apparent from the output voltage VOUT illustrated in FIG. 8, during a period between times T13 and T14, a period between times T14 and T15, a period between times T15 and T16, a period between times T16 and T17, a period between times T17 and T18, a period between times T18 and T19, and a period between times T19 and T20, pulses are applied in order from the output terminal of the voltage detection circuit 50 to the mode detection circuit 51 and the AND circuit 52. Only a pulse applied during the period between the times T16 and T17 has an intermediate potential between the high level and the low level. Pulses applied during the other periods have a high level potential.

In this case, the signal Z1 is in the high level, and hence the pulse applied from the output terminal is input to the clock generation circuit 53 and the data generation circuit 54 through the AND circuit 52.

The clock generation circuit 53 generates the clock signal CLK in response to the pulse applied from the output terminal. The data generation circuit 54 generates the data signal DATA in response to the pulse applied from the output terminal. Specifically, as is apparent from the clock signal CLK illustrated in FIG. 8, the clock generation circuit 53 generates a pulse which rises at the falling of a first pulse of the output voltage VOUT and falls at the falling of a second pulse thereof, during the period between the times T14 and T15. The same is expected during the period between the times T16 and T17 and the period between the times T18 and T19. As is apparent from the data signal DATA illustrated in FIG. 8, when the output voltage VOUT has the high level potential, the data generation circuit 54 generates a pulse. When the output voltage VOUT has the intermediate potential, the data generation circuit 54 does not generate the pulse. In other words, only during the period between the times T16 and T17, the data generation circuit 54 does not generate the pulse. During each of the other periods, the data generation circuit 54 generates the pulse.

During the periods between the times T13 and T20, the signals P and PX from the POR 71 are controlled to the low level.

[Operation Related to Set Data Z2 (Signals Q<1:2>) in Case of T15<T<T20]

The signals Q<1:2> are generated by the function of the counter 55 described above. As is apparent from the signal Q<1> illustrated in FIG. 8, the data signal DATA is in the high level at the falling of the clock signal CLK which corresponds to the time T15, and hence the signal Q<1> is in the high level. After that, the data signal DATA is in the low level at the falling of the next clock signal CLK, and hence the signal Q<1> is in the low level. After that, the data signal DATA is in the high level at the falling of the further next clock signal CLK, and hence the signal Q<1> is in the high level. As is apparent from the signal Q<2> illustrated in FIG. 8, the signal Q<2> is delayed from the signal Q<1> by one period of the clock signal CLK. As is apparent from the signal Q<d> illustrated in FIG. 8, the signal Q<d> is delayed from the signal Q<2> by one period of the clock signal CLK. Then, at the time T20, the signals Q<1:2> and Q<d> are loaded with <1, 0, 1>.

[Operation in Case of t=T20]

After a lapse of a predetermined time from the rising of the signal Q<d> which corresponds to the time T19, that is, after a lapse of a predetermined time from the start of setting of a last signal, the signal P_R from the counter 55 is controlled to the high level. With such control, the signal P_RX is controlled to the low level. Therefore, the loading of the signals Q<1:2> and Q<d> is completed and further signal loading is inhibited. In other words, the preparation for writing of the signals Q<1:2> into the respective nonvolatile memory elements 28 of the counter 55 is completed.

The signal P_R is controlled to the high level, and hence the signal Z1 from the mode detection circuit 51 is controlled to the low level. Therefore, the signal Z3 from the AND circuit 52 is also held to the low level, and hence further signal loading is inhibited.

[Operation in Case of T21≦t≦T22]

The power supply voltage VDD is set to a value higher than the voltage in the normal state. Then, the signals Q<1:2> are actually written into the respective nonvolatile memory elements 28 of the counter 55.

After that, the signals Q<1:2> are input as the set data Z2 to the voltage dividing circuit 56. The respective switches of the voltage dividing circuit 56 are on/off controlled in response to the signals Q<1:2>, and hence a new voltage division ratio of the voltage dividing circuit 56 is set to set the new divided voltage VDET.

Figure 9:
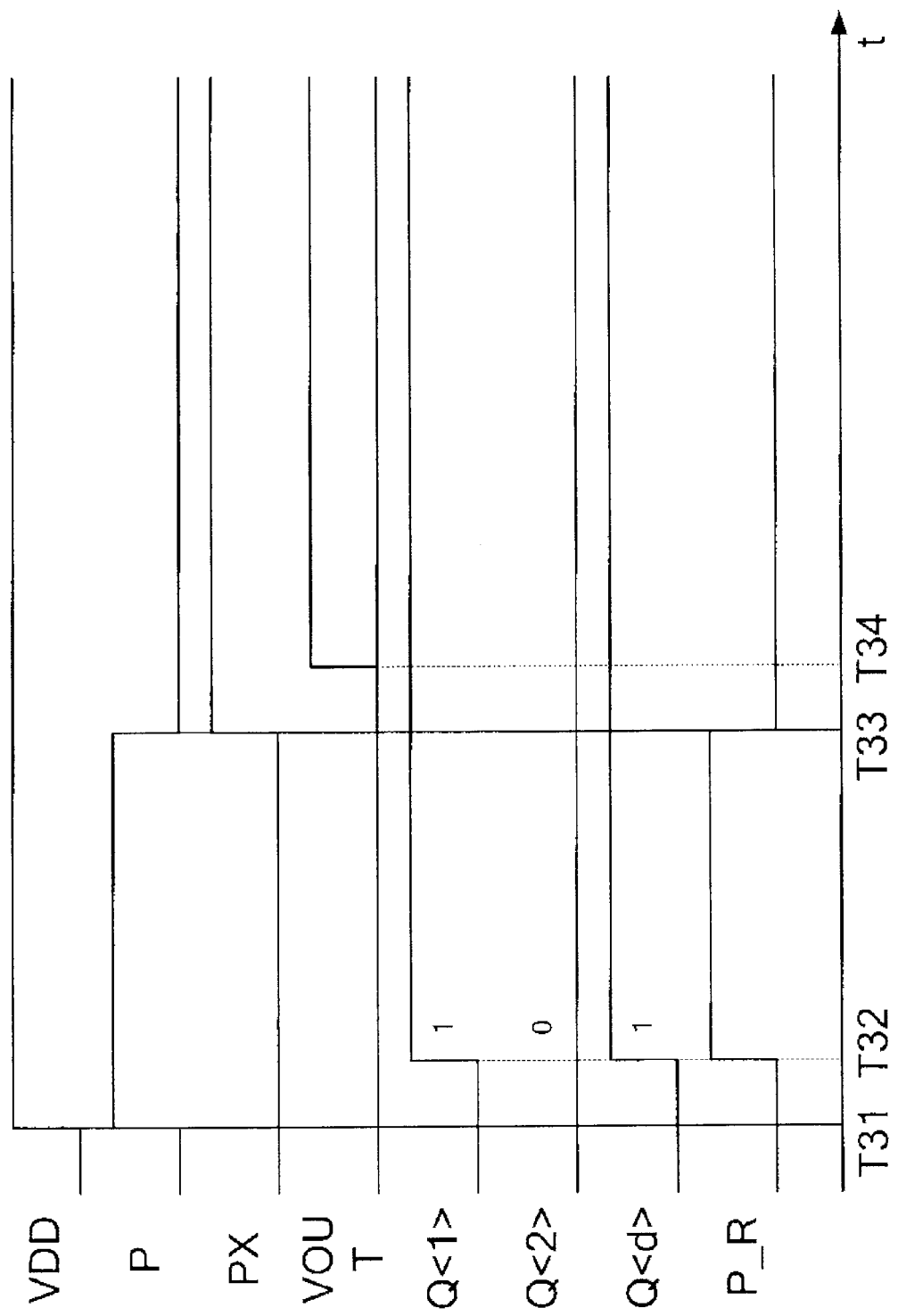
FIG. 9 is a third time chart illustrating the method of setting the voltage division ratio of the voltage dividing circuit.
Figure 10:
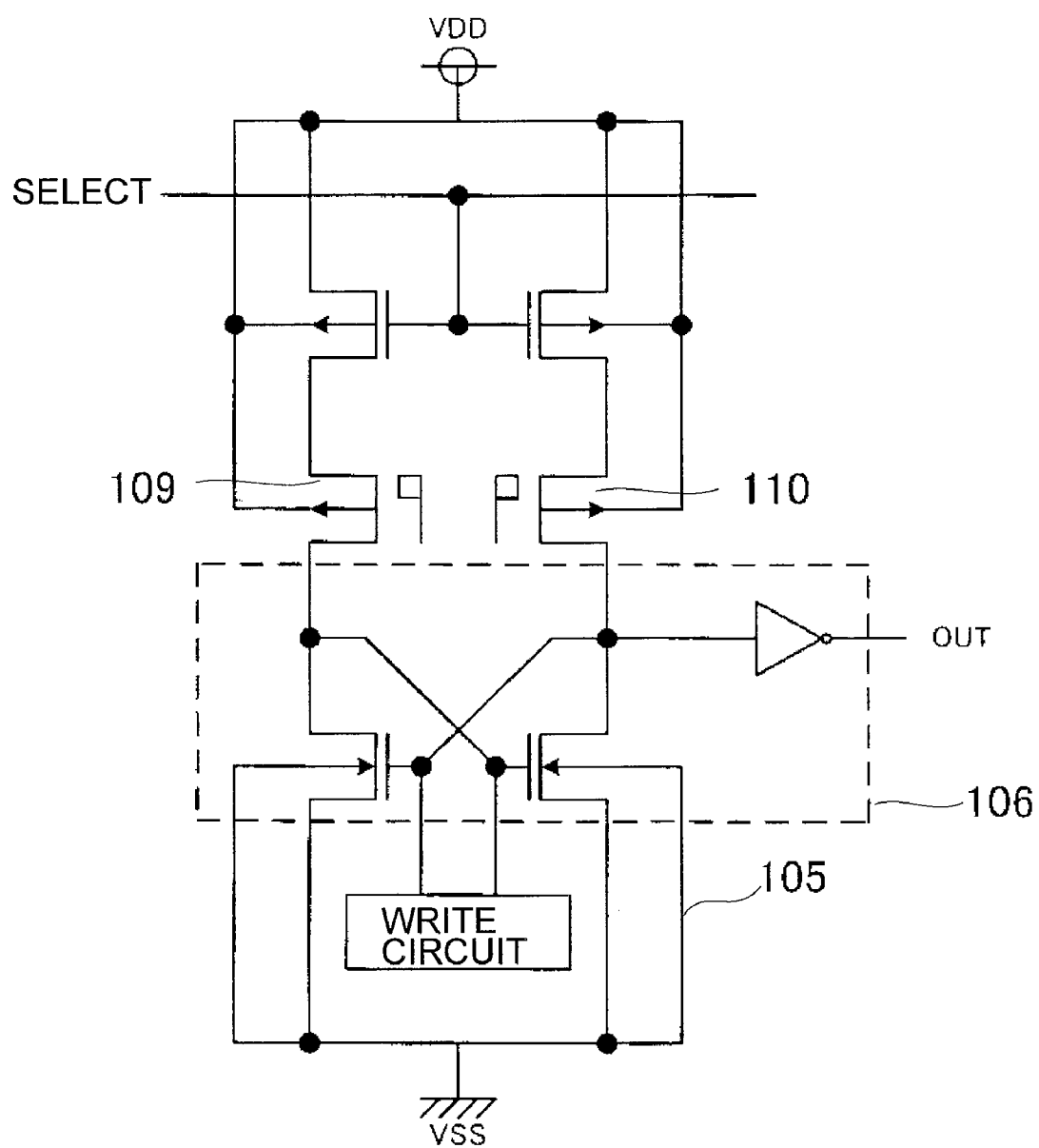
FIG. 10 is a block diagram illustrating a conventional memory circuit.

Next, an operation for reading the set data Z2 to the voltage dividing circuit 56 is described. FIG. 9 is a third time chart illustrating the method of setting the voltage division ratio of the voltage dividing circuit.

[Operation in Case of t=T31]

As illustrated in FIG. 9, the power supply voltage VDD rises, and with the rising, the signal P from the POR 71 also rises and becomes the high level. Then, predetermined internal nodes in the respective memory circuits of the counter 55 are reset.

[Operation in Case of t=T32]

After a lapse of a predetermined time from the time T31, the signal Q<d> is controlled to the high level, and hence the counter 55 controls, to the high level, the signal P_R supplied to the mode detection circuit 51 and the POR 71. When the signal P_R becomes the high level, the resetting of the predetermined internal nodes in the respective memory circuits of the counter 55 is released. Then, the counter 55 starts to read the set data Z2 (signals Q<1:2>) to the voltage dividing circuit 56. Therefore, the setting of a new voltage division ratio starts. The set voltage division ratio corresponds to a new desired detection voltage determined by the voltage detection circuit 50.

[Operation in Case of T32<t<T33]

A period between times T32 and T33 is a period required for the signal Q<d> controlled to the high level to be sufficiently read. Therefore, all the set data Z2 (signals Q<1:2>) may be completely read because of the period, and hence a new voltage division ratio may be completely set. Note that, during the period, in response to the rising of the signal P, the holding circuit 72 controls the comparator 57 to keep the output voltage VOUT to the low level. After the completion of the writing described above, even when the power supply voltage VDD is suspended, the set data Z2 (signals Q<1:2>) for setting the voltage division ratio are held in the respective nonvolatile memory elements 28. Therefore, when the power supply voltage VDD is supplied again, the set data Z2 (signals Q<1:2>) are read again and a new voltage division ratio is set again.

[Operation in Case of t=T33]

After a lapse of the period between the times T32 and T33, the signal P_R is controlled to the low level. With such control, the signal P is also controlled to the low level.

[Operation in Case of t=T34]

After a lapse of a predetermined time from the time T33, it is not likely to cause erroneous detection of the comparator 57, and hence the holding circuit 72 releases the above-mentioned control on the comparator 57. Therefore, the comparator 57 generates the output voltage VOUT based on the reference voltage VREF and the divided voltage VDET.

What is claimed is:

1. A memory circuit, comprising:
    a first switch provided between a first signal node and a second signal node;
    a nonvolatile memory element of a first conductivity type, including a source connected to a first power supply terminal;
    an inverter;
    a first MOS transistor of a second conductivity type which is controlled to an off state when the data is loaded to and written into the nonvolatile memory element, and controlled to an on state when the data is read, the first MOS transistor including a source connected to a second power supply terminal and a drain connected to the second signal node;
    a second MOS transistor of the second conductivity type which is turned on when a first power supply voltage is input and turned off when a second power supply voltage is input, the second MOS transistor including a gate connected to the second signal node, a source connected to the second power supply terminal, and a drain connected to an input terminal of the inverter;
    a third MOS transistor of the second conductivity type which is controlled to an off state when the data is loaded to and written into the nonvolatile memory element, and controlled to an on state when the data is read, the third MOS transistor including a source connected to the second power supply terminal through a current source and a drain connected to the input terminal of the inverter;
    a fourth MOS transistor of the first conductivity type, including a source connected to the first power supply terminal;
    a fifth MOS transistor of the first conductivity type, including a source connected to a drain of the nonvolatile memory element and a drain of the fourth MOS transistor, and a drain connected to the input terminal of the inverter;
    a first control circuit for controlling the fourth MOS transistor so that the fourth MOS transistor is turned on during loading and is turned off during writing and reading; and
    a second control circuit for controlling the fifth MOS transistor so that the fifth MOS transistor is turned off when the first power supply voltage is input during loading, turned on when the second power supply voltage is input during loading, and turned off during writing and reading.

2. A memory circuit according to claim 1, further comprising a second switch provided between the second signal node and an output terminal of the inverter.

3. A memory circuit according to claim 2, further comprising a latch provided at the output terminal of the inverter.

4. A voltage detection circuit, comprising:
    a reference voltage generation circuit for generating a reference voltage;
    a voltage dividing circuit for dividing a power supply voltage based on a voltage division ratio to generate a divided voltage;
    a comparator for comparing the reference voltage with the divided voltage; and
    a counter for holding set data to set the voltage division ratio, the counter comprising a plurality of the memory circuits according to claim 3 connected in series.

5. A voltage detection circuit according to claim 4, wherein:
    the counter operates as a shift register and comprises a delay circuit provided at an output terminal of a memory circuit located at a final stage, of the plurality of the memory circuits; and
    after a lapse of a predetermined time from a start of setting of a last signal, which is determined by the delay circuit, the counter completes all-signal setting and inhibits further signal setting.

6. A voltage detection circuit according to claim 5, further comprising:
    a clock generation circuit for generating a clock signal based on pulses sequentially supplied from an output terminal of the voltage detection circuit; and
    a data generation circuit for generating a data signal based on the pulses,
    wherein the counter holds the set data obtained based on the clock signal and the data signal.

7. A voltage detection circuit according to claim 4, further comprising:
    a clock generation circuit for generating a clock signal based on pulses sequentially supplied from an output terminal of the voltage detection circuit; and
    a data generation circuit for generating a data signal based on the pulses,
    wherein the counter holds the set data obtained based on the clock signal and the data signal.

* * * * *